United States Patent
Teppe et al.

(10) Patent No.: US 8,563,440 B2
(45) Date of Patent: Oct. 22, 2013

(54) METHOD FOR CHEMICALLY TREATING A SUBSTRATE

(75) Inventors: Andreas Teppe, Alzenau (DE); Berthold Schum, Biebergemund (DE); Dieter Franke, Vaals (NL); Ingo Schwirtlich, Miltenberg (DE); Knut Vaas, Alzenau (DE); Wilfried Schmidt, Schwaigern (DE)

(73) Assignee: Schott Solar AG, Mainz (DE)

( * ) Notice: Subject to any disclaimer, the term of this patent is extended or adjusted under 35 U.S.C. 154(b) by 228 days.

(21) Appl. No.: 13/059,560

(22) PCT Filed: Sep. 29, 2009

(86) PCT No.: PCT/EP2009/062608
§ 371 (c)(1),
(2), (4) Date: Mar. 22, 2011

(87) PCT Pub. No.: WO2010/037739
PCT Pub. Date: Apr. 8, 2010

(65) Prior Publication Data
US 2011/0183524 A1    Jul. 28, 2011

(30) Foreign Application Priority Data

Sep. 30, 2008    (DE) .......................... 10 2008 037 404

(51) Int. Cl.
*H01L 21/302*    (2006.01)
(52) U.S. Cl.
USPC ............. 438/747; 438/745; 438/753; 216/83; 216/90; 216/91; 216/96; 216/99; 257/E21.214
(58) Field of Classification Search
None
See application file for complete search history.

(56) References Cited

U.S. PATENT DOCUMENTS

| | | | |
|---|---|---|---|
| 7,943,526 B2 * | 5/2011 | Delahaye | ...................... 438/753 |
| 2007/0161247 A1 | 7/2007 | Koyata et al. | |
| 2008/0041725 A1 | 2/2008 | Klein et al. | |
| 2008/0233760 A1 | 9/2008 | Delahaye | |

FOREIGN PATENT DOCUMENTS

| | | | |
|---|---|---|---|
| DE | 10313127 | | 11/2004 |
| WO | WO2008071239 | * | 6/2008 |

OTHER PUBLICATIONS

Hauser et al., "Comparision of different techniques for edge isolation", Proceedings of 17th European Photovoltaic Solar Energy Conference and Exhibition, year 2001, pp. 1-4.*

* cited by examiner

*Primary Examiner* — Lan Vinh
*Assistant Examiner* — Jiong-Ping Lu
(74) *Attorney, Agent, or Firm* — Ladas & Parry, LLP

(57) ABSTRACT

A method for chemically treating a disc-shaped substrate having a bottom surface, a top surface and side surfaces by contacting a process medium that is fluid-chemically active with at least the bottom surface of the substrate. The substrate is moved relative to the process medium while forming a triple line between the substrate, the substrate medium and the atmosphere surrounding the substrate and medium. In order to chemically remove errors, particularly in the side surfaces, relative motion should be carried out while avoiding a contacting of the process medium with the top surface of the substrate, where the triple line is formed at a desired height of the side surface facing away from the process medium flow side in relation to the relative motion between the substrate and the process medium.

48 Claims, 2 Drawing Sheets

METHOD FOR CHEMICALLY TREATING A SUBSTRATE

Figure 1:
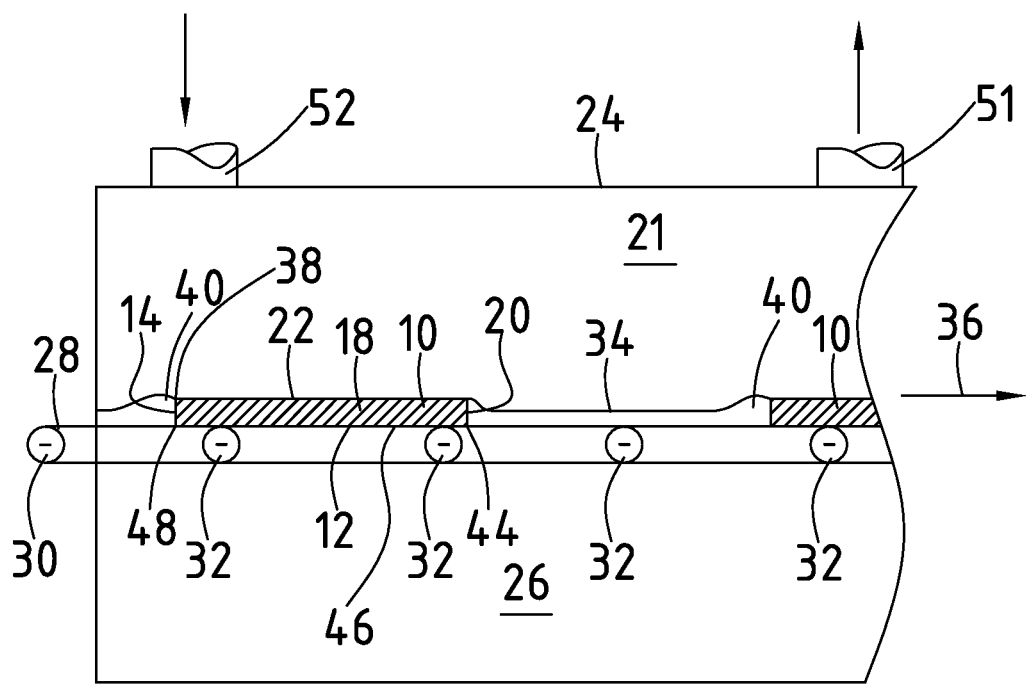

The invention concerns a process for the chemical treatment of a preferably wafer- or plate-shaped substrate that features a bottom surface, top surface and lateral surfaces by means of coming in contact with a liquid, chemically effective process medium with at least the bottom surface of the substrate, wherein the substrate is moved relative to the process medium during the simultaneous implementation of a triple-line between substrate, the substrate medium and the atmosphere that surrounds it.

According to prior art, a plurality of continuous flow processes are known for the chemical treatment of plate-shaped construction components in the case of which a chemical reaction with the surfaces of the construction component is adjusted by means of a process medium. In the semiconductor industry these are in particular etching processes for the chemical cleaning and patterning of semiconductor materials, in the particular application area of photovoltaics the chemical treatment of large-surfaced and thin silicon wafers.

Processes in the semiconductor industry impinge the wafer surfaces primarily with gaseous process media and/or liquid process media.

Processes are known where the wafer surfaces are impinged with gaseous process media in such a manner that all of the surfaces of the substrate enter into a chemical reaction with the gaseous medium. An example in this regard is the insertion into a hydrofluoric acid-vapor containing atmosphere, whereby oxide layers that are present on the substrate surface are ablated. A selective treatment of front and/or back sides and/or edges of the substrate is—if at all—only insufficiently possible in the process. An incomplete protection of a substrate side from wetting with the process medium can be partially achieved through the placing of the substrate onto a planar support, in such a way that in the area of the placement an impingement with the gaseous medium can be partially suppressed. Furthermore the possibility of the positioning of surface-on surface of respectively two wafer-shaped substrates exists so that the contact surface of the two substrates relative to one another can be partially excluded from the wetting with a gaseous process medium.

Also known is the treatment of a wafer surface by means of a liquid medium that reacts chemically with the surface (WO-A-2007/073886, WO-A-2007/073887), wherein the liquid medium is transported by means of rollers to the wafer surface and specifically only the wafer side that is facing the liquid is wetted.

Furthermore processes are known where the wafers are moved on thin transport rollers, wherein the contact of the liquid medium with the underlying wafer surface is adjusted by means of wetting at the liquid surface subject to the implementation of a liquid meniscus that is oriented downward from the edge of the wafer toward the liquid volume. In corresponding processes the wafer edges are excluded from the chemical reaction and are, at the most, treated in an uncontrolled and thereby not reproducible manner.

If thin substrates such as wafers exhibit damages or blemishes in the lateral areas, then it has to be determined during subsequent handling that the substrates are damaged, originating from the lateral surfaces, or there are break-off areas.

From the DE-A-103 13 127, a process for preventing the formation of short circuits in the case of silicon wafers can be deduced. For processing the undersides and, if applicable, the edges of the wafers are lowered into an etching bath.

The bottom surface as well as the lateral surfaces of a silicon wafer are processed continuously according to the WO-A-2005/093788 in a continuous flow process by conveying the silicon wafers on transport rollers through a liquid bath.

The DE-A-44 23 326 refers to a process for the etching of the backside of a silicon wafer structure. To that effect a substrate is fixated in a holding provision in order to then impinge one side with a etching medium and the other side with nitrogen.

It is the object of the present invention to further improve a process of the type previously described in such a manner that in particular blemishes that are present on the lateral surfaces are ablated chemically so that a reduction in breakage during the further handling is provided. In this context the chemical treating is to be conducted in a continuous flow process in order to operate in an economic manner from a process point of view.

According to the invention the problem is essentially solved in such a way that the relative movement is performed while avoiding a contact of the process mediums with the top surface of the substrate, that the triple-line is implemented in reference to the relative movement between the substrate and the process medium at a desired height on the lateral surface that is facing away from the stream side of the process medium and/or that the atmosphere is adjusted in reference to the partial pressures of the components present in the process medium in such a manner that the top surface maintains hydrophobic properties or hydrophobic properties are implemented in the top surface and/or that the substrate is preferably rotated during the movement relative to the process medium to an extent that a triple-line originates from every edge that runs between the top surface and the lateral surfaces or in the area of the lateral surfaces during the chemical treatment.

In particular it is provided that the triple-line at the edge facing away from the stream side of the process medium is implemented between the top surface and lateral surface of the substrate.

According to the invention a process is provided for the chemical treatment of thin plate-shaped or wafer-shaped substrates, in particular for the treatment of substrates for the manufacture of solar cells, where in a continuous flow process the sensitivity to breakage is reduced. By means of the process-typical processing the bottom surface as well as also the lateral surfaces of the substrate are treated in a continuous flow process simultaneously in such a manner that through the wetting with a chemically active process medium a chemical reaction takes place exclusively with the bottom surface and the lateral surfaces of the substrate in one process step, without the top surface being included along in the chemical reaction.

Relative to prior art, the advantage arises that the bottom surface as well as also the lateral surfaces of a wafer- of plate-shaped, therefore thin, substrate are treated chemically in a continuous flow process in a single process step for its subsequent application, wherein however a contamination of the top surface during the chemical treatment is avoided or suppressed. A specific adjustment of the relative movement between the substrate and the process medium takes place in such a manner that the triple-line is created between the substrate, the process medium and the atmosphere above the process medium at a desired height of the back surface, in reference to the stream direction and in particular at the rear upper edge of the back surface, so that correspondingly the lateral surface beside the bottom surface reacts chemically with the process medium with the consequence that a surface treatment and therefore the removal of material damages is performed, such as for example tears, micro cracks or surface roughness and textures, oxides and other areas undesirably for further process steps are ablated. An optimization regarding the implementation of the additional process steps, in particular in the case of the manufacture of solar cells with the simultaneous reduction of the sensitivity to breakage, is hereby provided.

In particular the possibility exists based on the teaching according to the invention that in the case of a doped semiconductor substrate an ablation of the underside- and lateral surfaces takes place during the processing in the process medium to an extent that the doped layer, in particular in the case of a semiconductor substrate intended for a solar cell, of the pn- or np-junction is ablated without that the pn- or np-junction that is present in the area of the top surface is attacked.

In particular it is thereby provided that for the purpose of avoiding a contamination of the front surface through the process medium the atmosphere surrounding the top surface is adjusted in the reaction space in such a manner that the components present in the atmosphere that emerge from the process medium feature partial pressures so that hydrophobic properties are implemented in the top surface or corresponding properties are maintained.

In this context provision is particularly made that the atmosphere is exchanged with the acidic vapors present in the reaction space in such a manner that the vapor pressure of the acidic components, which in reference to the substrate feature etching effects, exceeds the proportion of the components of the process medium that feature oxidative properties.

If the process medium contains hydrofluoric acid and nitric acid, then the partial pressure of the components should be equal so that the proportion of the HF molecules exceeds that of the $HNO_3$ molecules. An etching-away of the top surface takes place hereby with the consequence that the oxide layers present are ablated and hydrophobic properties arise thereby.

Consequently thin plate- or wafer-shaped substrates are wetted simultaneously only on the bottom surface and the lateral surfaces in a continuous dynamic process with a chemically active liquid in such a manner that a chemical ablation process arises on the wetting surfaces during the simultaneous maintenance of the partial pressure of the components of the chemically active liquid in the atmosphere above the substrate, meaning in the reaction space in which the continuous flow process is executed, in order to facilitate a further chemical reaction for achieving hydrophobicity.

Without leaving the invention the possibility exists thereby to achieve a hydrophobicity of the top surfaces already prior to the wetting of the bottom surface as well as the lateral surfaces with the process medium. If applicable, a pretreatment step can be provided to treat at least the top surface, if applicable all surfaces of the substrate, with a suitable chemical in such a manner that hydrophobic properties arise. During the continuous flow process an increase in liquid on the lateral surface that is facing away from the movement direction is hereby amplified, so that the desired triple-line establishes itself at the rear lateral surface, in particular the upper edge of the substrate for limiting the chemical ablation, on the lateral surface, starting from the beginning of the chemical attack. At the triple-line the substrate surface, the liquid medium and the gaseous surrounding atmosphere meet.

Due to the presence of the triple-line at the upper edge of the substrate the maximal wetting surface of the substrate is limited to its bottom surface, including the lateral surfaces.

In order that preferably each lateral surface is chemically treated to the required extent, the substrate is rotated during the continuous flow process to the required extent about an axis that runs perpendicularly to the plane spanned by the substrate. In the case of a rectangular-shaped substrate a rotation is implemented three times, each by respectively 90° in order to treat all lateral surfaces. If it concerns a substrate that is, in a plan view, circular, then it is rotated to an extent so that the entire circumferentially running lateral surface is processed to the desired extent. In this context lateral surfaces are to be also understood as a circumferentially running lateral surface of the kind previously explained.

The rotation of the substrate is also then realized, and is to be understood in this contest, when the substrate is removed from the process medium after the processing of one of the lateral surfaces, is rotated, and is then again guided through that or a different process medium.

The relative movement between the substrate and the process medium takes place according to the invention such that a wake develops that then, when the lateral surfaces are to be treated chemically completely, runs along the upper edge of the lateral surface that is on the backside in relation to the movement direction.

If it is preferably provided that the substrate is a semiconductor substrate, in particular a silicon semiconductor substrate, then the teaching according to the invention is not limited thereto. Rather all materials are suitable for which a surface ablation is possible by means of a chemical reaction.

Independent thereof the substrate should feature, in a plan view, a quadratic, pseudo-quadratic, rectangular or circular geometry, wherein the substrate thickness is in particular in the range between 50 μm and 500 μm, preferably however between 100 μm and 200 μm.

If a substrate featuring, in a plan view, a geometry with corners is processed, then at least one edge, preferably every edge should feature a length in the range between 100 mm and 350 mm, preferably between 125 mm and 156 mm. Consequently the process according to the invention is in particular suitable for wafers that are intended for the manufacture of solar cells.

If the possibility exists to let the process medium stream toward the substrate, then preferably the substrate is guided through the process medium. The possibility of course also exists to on the one hand let the process medium stream and on the other to move the substrate opposite to the streaming direction of the process medium.

As a process medium a material is utilized that contains as components at least one aqueous acid with oxidative effect in regard to the substrate and at least one aqueous acid with a complexing effect in regard to the oxide of the substrate.

In particular the process medium should contain components from the group $H_2O$, HF, $HNO_3$, HCl, and oxidation means such as $H_2O_2$, $NO_2$, ammonium fluoride, acetic acid, sulphuric acid, phosphoric acid. Preferably the process medium contains aqueous hydrofluoric acid and aqueous nitric acid during the processing of substrates that contain silicon or consist of silicon.

Independent thereof should the acid components represent a component between 0.1 vol. % and 70 vol. %, wherein the sum of all components of the process medium amounts to 100 vol. %.

In regard to HF and $HNO_3$ as components it is provided that the proportion of HF amounts to between 1.0 wt. % and 20 wt. % and the proportion of $HNO_3$ amounts to between 20 wt. % and 70 wt. %, respectively also referenced to 100 wt. % of all components.

Particularly good results can be achieved if the weight ratio of HF to $HNO_3$ is in a proportion of $1:8 \leq HF:HNO_3 \leq 1:3$. By these means an atmosphere is formed above the process medium during the processing, meaning the area of the reaction space in which the unwetted top surface of the substrate is located, said atmosphere having the effect of etching the top surface with the consequence that oxide layers are ablated and hydrophobic properties are thereby provided.

There is however also the possibility to utilize a substrate that is patterned at least in regard to the top surface in such a manner that a lotus effect results, meaning the desired hydrophobic properties. In this case the atmosphere that has an etching effect assures that the hydrophobic properties are maintained.

Independent thereof the treatment should be performed at a temperature T of the process medium with $5°\ C.\leq T\leq 45°\ C.$, preferably $10°\ C.\leq T\leq 25°\ C.$ As particularly preferred temperature range is however indicated that lies below room temperature, meaning in the range between $5°\ C.\leq T<T_R$.

If the substrate is pretreated in order to adjust desired hydrophobic properties, then in the case of a silicon substrate an aqueous solution of hydrofluoric acid should be utilized that features between 0.1 wt. % and 40 wt. %, preferably between 1 wt. % and 10 wt. %. The process temperature should thereby be between 5° C. and 65° C., specifically between 20° C. and 45° C., preferably between 20° C. and 40° C.

Time spans between 1 sec. and 10 min., in particular between 5 sec. and 60 sec., are to be mentioned as preferred pretreatment times.

In the context of the continuous flow process the relative velocity V between the substrate and the process medium should be between 0.1 m/min. and 10 m/min., preferably between 0.5 m/min. and 5 m/min.

The total process time without a possible pretreatment should be between 5 sec. and 10 min., in particular between 15 sec. and 5 min.

During the processing of the bottom side of the substrate as well as the lateral surfaces the atmosphere should be modified by means of the addition of inactive and/or reactive gas components in such a way that an etching effect by the atmosphere that is acting on the top surface results.

Further details, advantages, and characteristics of the invention can be gathered not only from the claims, from which the characteristics can be gathered—as such and/or in combination—but also from the following description of preferred embodiment examples that can be gleaned from the drawing.

Figure 2:
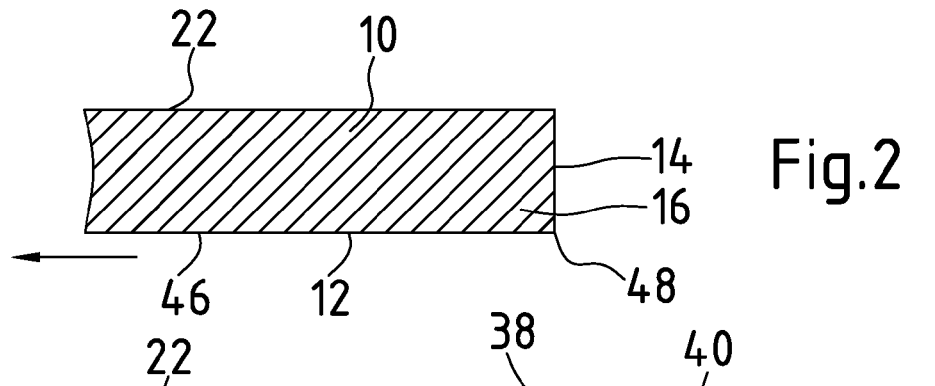
Figure 3:
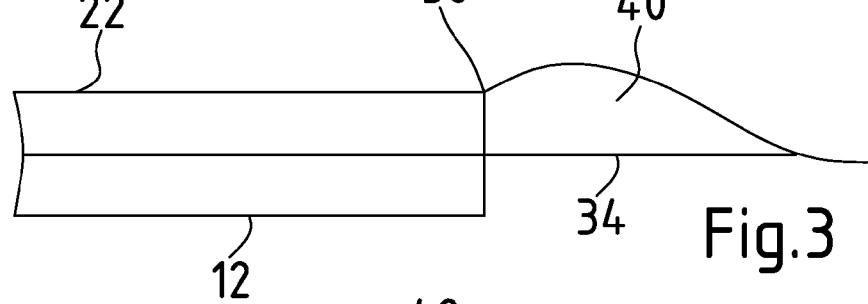
Figure 4:
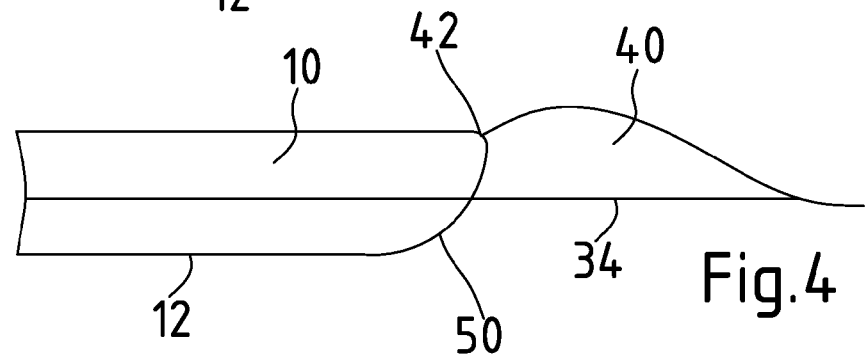
Figure 5:
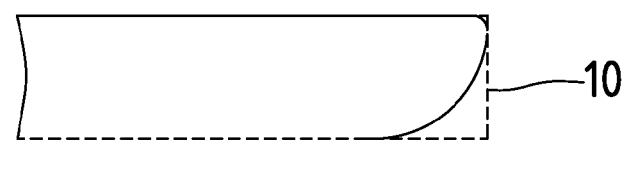
Figure 6:
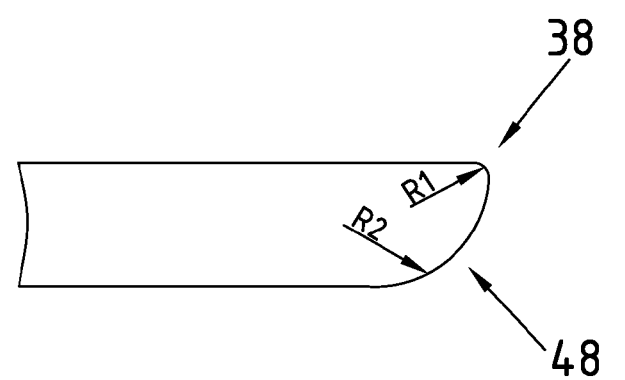

It is shown:

FIG. 1 a schematic diagram of a reaction space for the chemical treatment of substrates in a section and in a cut, FIG. 2, a section of a substrate prior to its treatment, FIG. 3, a substrate during its relative movement in a chemically acting liquid process medium, FIG. 4, a substrate during the chemical treatment after already partially ablated outer surfaces, FIG. 5, a comparison between a chemically treated substrate and a substrate prior to its chemical treatment and FIG. 6, a section of a chemically treated substrate.

Based on the figures, in which fundamentally equal elements are provided with the same reference symbols, the process according to the invention for the chemical treatment of a substrate is to be further explained, said substrate being—without limiting the invention—in the embodiment example a substrate 10 that consists of silicon and has the form of a, in plan view, rectangular wafer that is intended for the manufacture of a solar cell. Also explained in what follows is the processing of the lateral surfaces over their entire surfaces, even if also specifically only a lower partial area could be treated chemically. The substrate can, prior to chemical treatment that is explained in what follows, be doped previously on all sides in order to implement at the spacing of the original outer surface a pn-junction, provided that the substrate 10 is p-conducting. If the substrate is n-conducting, a np-junction is implemented through doping. The doping takes place preferably by usual means with phosphor- or boron-containing doping materials.

In order to process the substrate 10 according to the teaching of the invention only on its bottom surface 12 as well as its lateral surfaces 14, 16, 18, 20 and not on its top surface 22 in a reproducible manner, meaning to treat chemically in order to for example ablate oxide layers, material damages such as for example tears, micro tears or surface roughnesses and textures, in particular on the lateral surface areas or the pn- or np-junctions running in the area of the lateral surfaces 14, 16, 18, 20 as well as the bottom surface 12 by means of etching, the substrate 10 is exposed to a liquid process medium 26 in a reaction—or process space 21 that is enclosed by a housing 24—also referred to as process chamber—; said process medium can contain, in the embodiment example for the substrate 10 that consists of silicon, at least as components hydrofluoric acid and nitric acid as well as besides $H_2O$ additional components such as oxidation means or ammonium fluoride, acetic acid, sulphuric acid, phosphoric acid or other acids. Essential is however that besides an oxidatively acting acid such as $HNO_3$ also an acid with a complexing effect such as HF is contained in the process medium 26.

The substrate 10 is transported, in a continuous dynamic process through the reaction space 21 during the simultaneous wetting of the bottom surface 12 as well as the lateral surfaces 14, 16, 18, 20, by means that are described in what follows, while avoiding the wetting of the top surfaces 22, on a transport band 28 or a similarly effective transport means through the reaction space 21, meaning through the housing 24. The process medium 26 is thereby, during the processing, preferably circulated and exchanged to an extent that the desired concentration of the components that effect the chemical reactions is at hand. It is thereby particularly provided that the acid components are in the range of 0.1 vol. % and 70 vol. %, wherein the acid concentration regarding HF can be in the range between 0.1 wt. % and 20 wt. % and of $HNO_3$ in the range between 20 wt. % and 70 wt. %. If HF and $HNO_3$ are present, the proportion should be between 1:8 and 1:3.

During the action of the process medium 26 on the substrate 10 the former should be adjusted to a temperature preferably below room temperature $T_R$, for example in the range $5°\ C.\leq T<T_R$ Before the substrate 10 is introduced into the process chamber 24, a substrate 10 featuring a plate-shaped cuboid geometry can be pretreated in such a manner that hydrophobic surface properties arise. These are desirable in order to assure that during the interaction with the process medium 26 in the process chamber 24 the top surface 22 is not wetted with the process medium 26.

The pretreatment takes place preferably outside the process chamber 24 and can take place by means of immersing, spraying, nebulizing or other wetting processes, wherein the immersing process is to be preferred. As process media that evoke a hydrophobic property of the surface or surfaces of the substrate 10 hydrofluoric acid or similarly acting acids are preferably applied. Alternatively a mixture of hydrofluoric acid and nitric acid could also be utilized, whereby an oxide-free fine-pored surface layer that features a lotus effect an be implemented on the substrate 10.

After the pretreatment, meaning in the embodiment example the immersion, provision is preferably made that a stripping or blowing off of the remaining process media that adhere to the surface of the substrate 10 takes place in order to avoid or to reduce their spreading. Surface in the case of the pretreatment means that at least the bottom surface as well as the lateral surfaces are stripped or blown-off. In case it it needed, a spraying process in $H_2O$ and a drying process in an air current can be provided, whereby in this case all surfaces of the substrate 10 are treated. In the case of an application of an air space it can have a temperature between room temperature and 100° C., wherein the preferred temperature range should be between 30° C. and 50° C.

After the, if applicable, pretreatment has taken place the substrate 10 is introduced, via the transport band 28 or another suitable transport medium (and being) guided or redirected by means of rollers 30, 32 or other suitable systems, into the process chamber 24, whereby the transport plane established by the transport band 28 relative to the liquid level 34 is adjusted depending on the thickness of the substrate 10 in such a manner that the entire bottom surface 12 as well as area-wise the lateral surfaces 14, 16, 18, 20 are brought into contact with the process medium 26, without the process medium 26 wetting the top surface 22 or stream alongside of it. The transport velocity of the substrate 10 that is transported in the direction of the arrow 36 through the process chamber 24 is adjusted in such a manner, depending on the spacing of the liquid top surface 34, meaning the liquid level, to the top surface 22 of the substrate 10 being transported through the process medium 26, that a wake of the process medium 26 forms at the back side surface 14 along the upper edge 38 that runs between the back side surface 14 and the top surface 22 of the substrate 10, and therefore a triple-line 42 arises along the edge 38 at which the process medium 26, the substrate 10 and the atmosphere merge into one another.

Through the action of the process medium 26 on the lateral surfaces 14, 16, 18, 20 as well as the bottom surface 12 a removal by etching takes place that exhibits itself through an ablation at the edges that delimit the bottom surface 12, as this is purely in principle clarified by the rounding 50 in FIG. 4.

Since the triple-line 42 arises in principle only at the upper edge of the lateral surface—if applicable at the desired height on the lateral surface—that is facing away from the transport direction 36, according to the invention however every lateral surface 14, 16, 18, 20 is to be etched away surface-wise to the desired extent, the substrate 10 is correspondingly rotated during the transport through the process chamber 24, meaning in the case of a quadrangular substrate for a total of respectively three times by 90°.

In particular it is provided that the substrate 10 interacts with the process medium 26 for a duration that effects a removal through etching on the bottom surface 12 as well as the lateral surfaces 14, 16, 18, 20 between 0.5 µm and 3 µm, in particular in the range of 1 µm.

This etching removal serves the purpose of eliminating oxide layers, material damages such as for example tears, micro tears or surface roughnesses and textures, and in particular in the case of a prior impingement with a doping agent that, in the case of an existing doping layer, serves the purpose of an application-typical further processing for, for example, a solar cell in order to implement a pn- or np-junction.

Consequently the removal of a corresponding pn- or np-junction in the area of the bottom surface 12 as well as the lateral surfaces 14, 16, 18, 20 over their respective entire extent can be viewed as a process-typical characteristic of the invention in the case of the processing of substrates in the form of doped wafers that are intended for the manufacture of solar cells.

The invention is not limited to a corresponding application case. The same applies in regard to the extent of the etching removal. As a result the possibility is readily provided that an etching removal on the bottom surface 12 as well as the lateral surfaces 14, 16, 18, 20 between 5 µm and 60 µm, in particular in the range of 20 µm, takes place. In this case the etching removal serves in particular the purpose of eliminating a surface roughness that serves the purpose of an application-typical further processing for the manufacture of surface texture, which is only present on the front side, on a solar cell. The elimination of the surface texture on the bottom surface as well as the lateral surfaces can also be viewed as a process-typical characteristic of the invention.

Without leaving the invention the possibility furthermore exists that the silicon wafer is subjected, prior to the further processing according to the invention, to a one-sided etching process according to prior art that leads to a surface roughness or -texture only on the surface that is etched.

For the elimination of the still remaining surface damage of the silicon wafer on the top surface and the lateral surfaces 14, 16, 18, 20 that were not etched previously, an etching removal between 1 µm and 100 µm is adjusted on the bottom side 12 and the lateral surfaces 14, 16, 18, 20, preferably an etching removal between 5 µm and 20 µm that leads to a smooth surface. Not only is thereby the desired elimination of surface damages attained while achieving smooth lateral surfaces 14, 16, 18, 20 and thereby an improved mechanical loading capacity, but also an advantageous morphology that is advantageous for the solar cells manufactured therefrom (one-sided surface structure) through a specifically selective and thereby economical etching.

By means of the removal of the roughnesses on the bottom surfaces 12 or the lateral surfaces 14, 16, 18, 20 and thereby the elimination of material damages and tears the substrate 10 is provided with an improvement of strength, in particular in the case of the treatment of thin silicon wafers. Experiments have revealed that in the case of a 156 mm×156 mm sized and 180 µm thick silicon wafer an improvement of the resistance against breakage of over 50% can be achieved.

Etching removals in the range between 1 µm and 100 µm, in particular in the range between 5 µm and 20 µm, lead to an elimination of surface damages of the substrate 10 by means of mechanical processes such sawing, milling, grinding or also other typical cutting processes, such as laser treatments.

Through the elimination of the surface damages on the bottom surfaces 12 as well as also on the lateral surfaces 14, 16, 18, 20 it is achieved that during mechanical stresses that particularly arise through the handling that follows the processing the resistance against breakage of the substrate 10 is significantly increased.

Since according to the invention it is provided that an interaction and therefore an etching-away of the substrate 10 takes place exclusively on the bottom surface 12 as well as the lateral surfaces 14, 16, 18, 20, a wetting of the top surface 22 is avoided due to the fact that the top surface 22 is hydrophobic.

The hydrophobic properties can be adjusted by means of a—as previously described—pretreatment of the substrate 10 and/or during the interaction of the substrate 10 with the gases of the process medium 26 in the process chamber 24. As an example an atmosphere can be adjusted, during the chemical etching of the substrate under side 12 as well as the lateral surfaces 14, 16, 18, 20 above the process medium 26 and thereby above the substrate top surface 22, that contains besides air also HF-, NOX- and $HNO_3$-containing gas components, wherein the partial pressures of the components are adjusted in such a manner that a fine-pored porous layer forms on the top surface 22 of the substrate 10. Simultaneously possible oxide layers are ablated. Hereby an enhanced hydrophobic surface is achieved through the specific lotus effect in order to thereby fundamentally avoid a wetting by the process medium 26. In the context the nitrous gases created during the etching of the substrate bottom side 12 as well as the lateral surfaces 14, 16, 18, 20 are advantageously utilized. Furthermore by means of the reaction heat that is released in connection with the emerging NOX-reaction gases during the etching HF, $HNO_3$, and water can be released into the gas atmosphere. Through the partial pressures of HF, $HNO_3$, $NO_2$ in combination with the water vapor that establish themselves through a suitable choice of parameters of the etching bath compositions and -temperature, as well as a complementary dynamic exchange of the present gas mixture from the reaction space 21 through suctioning off of gases and admixing of gases of a desired composition a top surface 22 featuring hydrophobic properties can be generated. Gases are for example suctioned off via an opening 51 and gases of a desire composition are introduced via an opening 52 of the housing 24. The introduced gases can thereby contain reactive or inert components in order to have available above the substrate an atmosphere of a composition that establishes or preserves the desired hydrophobic properties on the top surface 22.

If the triple-line—as described previously—is preferably adjusted at the upper edge 38 between the back side surface facing away in reference to the movement direction—in the embodiment example of the lateral surface 14—and the top surface 22, the teaching according to the invention is—as previously mentioned—of course not abandoned if the triple-line is adjusted at a desired height on the respective back side surface 14, 16, 18, 20.

The possibility also exists to process only one or selected lateral surfaces 14, 16, 18, 20 to a desired extent, meaning to adjust on their upper edges a triple-line, namely depending on the additional process steps to be executed after the chemical treatment according to the invention. Top surface layers on the lateral surfaces 14, 16, 18, 20 can also be ablated at a different thickness. Correspondingly the corresponding lateral surface has to be aligned more or less long facing away from the movement direction.

Based on FIG. 5 it is to be clarified that based on the teaching according to the invention the lateral surfaces 14, 16, 18, 20 and the bottom surface 12 are ablated. In that regard the extent geometry of the substrate 10 is represented by means of a dashed representation prior to its treatment. The solid representation clarifies purely in principle the geometry of the substrate 10 after its treatment according to the invention.

Furthermore FIG. 6 conveys that the edges 38, 48 of the substrate are rounded differently by means of the chemical treatment in the process medium 26. In this regard the upper edge 38 features in the case when the wake 40 originates therefrom, meaning the triple-line runs in the transition area between the top surface 22 and the lateral surface 14, a smaller radius R1 than in the area of the edge 48 that was ablated below, meaning in the transition area between the lateral surface 14 and the bottom surface 12 (radius R2).

The different radii R1, R2 result from the fact that in the area of the triple-line the etching removal is smaller than in the area of the underside of the substrate 10. Therefore the proportion should be in the case of silicon as a substrate material about >1:10, in particular 1:20.

The invention claimed is:

1. A process for chemical treatment of a substrate that features a top surface and lateral surfaces by means of making contact with a liquid, chemically effective process medium with at least the bottom surface of the substrate, wherein the substrate is moved relative to the process medium during the simultaneous implementation of a triple-line between the substrate, the process medium and the atmosphere that surrounds it, and a chemical ablation reaction is achieved, characterized in that, the relative movement is performed while avoiding a contact of the process medium with the top surface of the substrate, that the triple-line is implemented in reference to the relative movement between the substrate and the process medium at a height on the lateral surface that is facing away from the side of the process medium that is moved towards the substrate, that the atmosphere is adjusted in regard to the partial pressures of the components present in the process medium in such a manner that in the top surface, hydrophobic properties are implemented and that the substrate is rotated about an axis that runs perpendicularly to the plane spanned by the substrate, that a triple-line originates from every upper edge of the substrate or from the lateral surfaces during the chemical treatment.

2. The process according to claim 1, characterized in that, the triple-line is implemented between the top surface and lateral surface.

3. The process according to claim 1, characterized in that, the substrate is moved relative to the process medium during the simultaneous implementation of a wake that originates from the substrate and consists of the process medium and that originates from the edge or from the lateral surface that is delimited by the edge.

4. The process according to claim 1, characterized in that, as a substrate a semiconductor substrate is utilized.

5. The process according to claim 4, characterized in that the semiconductor substrate is a silicon-semiconductor substrate.

6. The process according to claim 1, characterized in that, the chemical treatment takes place to an extent that the substrate features smooth underside- and lateral surfaces after the treatment.

7. The process according to claim 1, characterized in that, a layer thickness between 1 µm and 100 µm is ablated by means of the chemical treatment.

8. The process according to claim 1, characterized in that, as a substrate a semiconductor substrate, is utilized that is doped at least on the bottom surface and/or at least on one lateral surface, and that the doped area is removed by means of the chemical treatment.

9. The process according to claim 8, characterized in that the semiconductor substrate is a silicon substrate with pn junction.

10. The process according to claim 1, characterized in that, as a substrate an item is utilized that features, in plan view, a quadratic, pseudo-quadratic, rectangular or circular geometry.

11. The process according to claim 1, characterized in that, as a substrate, an item is utilized that features a thickness d with 50 µm≤d≤500 µm.

12. The process according to claim 11, characterized in that the thickness is d where 100 µm≤d≤200 µm.

13. The process according to claim 1, characterized in that, a substrate featuring, in a plan view, a geometry with corners is utilized with edges of which at least one edge features a length L with 100 mm≤L≤350 mm.

14. The process according to claim 13, characterized in that every edge features a length L with 125 mm≤L≤156 mm.

15. The process according to claim 1, characterized in that, the substrate is moved, during an at least area-wise wetting of the lateral surfaces by the process medium, relative to it.

16. The process according to claim 1, characterized in that, as a process medium, a material is utilized that comprises as components at least one aqueous acid with oxidative effect in regard to the substrate and at least one aqueous acid with a complexing effect in regard to the oxide of the substrate.

17. The process according to claim 1, characterized in that, as the process medium, a medium is used that comprises at least one member selected from the group consisting of $H_2O$, HF, $HNO_3$, and HCl, and at least one member selected from the group consisting of $H_2O_2$, $NO_2$, ammonium fluoride, acetic acid, sulphuric acid, and phosphoric acid.

18. The process according to claim 17, characterized in that, as a process medium, a medium is utilized that comprises at least aqueous hydrofluoric acid and aqueous nitric acid.

19. The process according to claim 17, characterized in that, as a process medium, a medium is utilized where the acid components amount to between 0.1 vol. % and 70 vol. %, wherein the sum of all components in the process medium amount to 100 vol. %.

20. The process according to claim 17, characterized in that, as a process medium a medium is utilized where the proportion of HF amounts to between 1.0 wt. % and 20 wt. % and the proportion of $HNO_3$ amounts to between 20 wt. % and 70 wt. %, whereby the sum of all components in the process medium is 100 wt. %.

21. The process according to claim 1, characterized in that, as a process medium, a medium is utilized where the weight ratio of HF to $HNO_3$ is as $1:8 \leq HF:HNO_3 \leq 1:3$.

22. The process according to claim 1, characterized in that, the treatment is performed at a temperature T of the process medium with $5°\,C. \leq T \leq 45°\,C$.

23. The process according to claim 22, characterized in that the treatment is performed at a temperature T of the process medium with $10°\,C. \leq T \leq 25°\,C$.

24. The process according to claim 22, characterized in that the treatment is performed at a temperature T of the process medium with $5°\,C. \leq T < T_R$ with $T_R \leq$ room temperature.

25. The process according to claim 1, characterized in that, the substrate is provided prior to the chemical treatment at least on its top surface with hydrophobic properties.

26. The process according to claim 25, characterized in that, at least the top surface is provided with a structure that effects a lotus effect.

27. The process according to claim 25, characterized in that, at least the top surface is implemented in an oxide-free and/or smooth manner.

28. The process according to claim 1, characterized in that, the substrate is pretreated with an aqueous solution of hydrofluoric acid with a concentration of between 0.1 wt. % and 40 wt. %.

29. The process according to claim 28, characterized in that, the concentration is between 1 wt. % and 10 wt. %.

30. The process according to claim 28, characterized in that the concentration of hydrofluoric acid is between 1 wt. % and 10 wt. %.

31. The process according to claim 1, characterized in that, the substrate is treated at a temperature $T_v$ with $5°\,C. \leq T_v \leq 65°\,C$.

32. The process according to claim 31, characterized in that the substrate is treated at a temperature $T_v$ with $20°\,C. \leq T_v \leq 45°\,C$.

33. The process according to claim 31, characterized in that the substrate is treated at a temperature $T_v$ with $20°\,C. \leq T_v \leq 40°\,C$.

34. The process according to claim 1, characterized in that, the substrate interacts after a possible pretreatment with the process medium over the time period $t_H$ of $5\,\text{sec.} \leq t_H \leq 10\,\text{min}$.

35. The process according to claim 34, characterized in that, the pretreatment is executed over a time t of $1\,\text{sec.} \leq t \leq 10\,\text{min}$.

36. The process according to claim 35, characterized in that the time t is $5\,\text{sec.} \leq t \leq 60\,\text{sec}$.

37. The process according to claim 34, characterized in that the time period $t_H$ is $15\,\text{sec} \leq t_H \leq 5\,\text{min}$.

38. The process according to claim 1, characterized in that, the chemical treatment is executed at a relative velocity between the substrate and the process medium of $0.1\,\text{m/min.} \leq V \leq 10\,\text{m/min}$.

39. The process according to claim 38, characterized in that the relative velocity V is $0.5\,\text{m/min.} \leq V \leq 10\,\text{m/min}$.

40. The process according to claim 38, characterized in that the relative velocity V is $0.5\,\text{m/min.} \leq V \leq 5\,\text{m/min}$.

41. The process according to claim 1, characterized in that, the substrate is moved toward the process medium.

42. The process according to claim 1, characterized in that, during the chemical treatment, the components of the atmosphere that surrounds the upper side of the substrate is adjusted in such a manner that the partial pressure of the acid with oxidizing effect is equal or approximately equal or smaller than the partial pressure of the acid with complexing effect.

43. The process according to claim 42, characterized in that the acid with oxidizing effect is $HNO_3$.

44. The process according to claim 42, characterized in that the acid with complexing effect is HF.

45. The process according to claim 1, characterized in that, during the chemical treatment, the atmosphere is modified through the specific addition of inactive and/or reactive gas components in such a manner that an etching effect by the atmosphere acting on the top surface results.

46. The process according to claim 1, characterized in that, the atmosphere is exchanged by means of the addition of HF vapor between $100\,\text{mg/m}^3$ and $1.000\,\text{mg/m}^3$, and/or $HNO_3$-vapor in the range between $100\,\text{mg/m}^3$ and $3.000\,\text{mg/m}^3$, and/or inert gases such as nitrogen or argon, and/or air at an exchange rate between 10-times to 100-times per hour.

47. The process according to claim 1, characterized in that, at least one edge features a length L with $100\,\text{mm} \leq L \leq 350\,\text{mm}$.

48. The process according to claim 1, characterized in that, at least one edge features a length L with $125\,\text{mm} \leq L \leq 156\,\text{mm}$.

* * * * *